United States Patent
Liu et al.

(10) Patent No.: US 9,904,743 B2
(45) Date of Patent: Feb. 27, 2018

(54) METHOD FOR ANALYZING INTERCONNECT PROCESS VARIATION

(71) Applicant: Taiwan Semiconductor Manufacturing Co., Ltd., Hsin-Chu (TW)

(72) Inventors: Te-Yu Liu, Zhongli (TW); Cheng Hsiao, Hsinchu (TW); Chia-Yi Chen, Hsinchu (TW); Wen-Cheng Huang, Changhua (TW); Ke-Wei Su, Zhubei (TW); Ke-Ying Su, Taipei (TW); Ping-Hung Yuh, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 142 days.

(21) Appl. No.: 14/926,434

(22) Filed: Oct. 29, 2015

(65) Prior Publication Data
US 2017/0122998 A1 May 4, 2017

(51) Int. Cl.
*G01R 31/02* (2006.01)
*G06F 17/50* (2006.01)
*G01R 31/28* (2006.01)

(52) U.S. Cl.
CPC ............. *G06F 17/50* (2013.01); *G01R 31/28* (2013.01); *G01R 31/2856* (2013.01)

(58) Field of Classification Search
CPC  G01R 31/2856; G01R 17/50; G01R 17/5068; G01R 17/5072; G01R 17/5081;
(Continued)

(56) References Cited

U.S. PATENT DOCUMENTS 5,471,409 A * 11/1995 Tani ................... G06F 17/5022
                                                703/14
8,453,095 B2    5/2013 Su et al.
(Continued)

OTHER PUBLICATIONS

Electronics Mentor. "Process Corners . . . What and Why?" Jul. 11, 2013. Retrieved from http://electronicsmentor.blogspot.com/2013/07/processcornerswhatandwhy.html.
(Continued)

*Primary Examiner* — Thang Le
(74) *Attorney, Agent, or Firm* — Eschweiler & Potashnik, LLC

(57) ABSTRACT

A method and a corresponding system for analyzing process variation and parasitic resistance-capacitance (RC) elements in an interconnect structure of an integrated circuit (IC) are provided. First descriptions of parasitic RC elements in an interconnect structure of an IC are generated. The first descriptions describe the parasitic RC elements respectively at a typical process corner and a peripheral process corner. Sensitivity values are generated at the peripheral process corner from the first descriptions. The sensitivity values respectively quantify how sensitive the parasitic RC elements are to process variation. The sensitivity values are combined into a second description of the parasitic RC elements that describes the parasitic RC elements as a function of a process variation parameter. Simulation is performed on the second description by repeatedly simulating the second description with different values for the process variation parameter.

20 Claims, 10 Drawing Sheets

(58) Field of Classification Search
CPC .............. G01R 17/504; G01R 17/5045; G01R 17/5036; G06F 2217/10; G06F 2217/12; G06F 2217/82
See application file for complete search history.

(56) References Cited

U.S. PATENT DOCUMENTS

| | | | |
|---|---|---|---|
| 8,645,899 B2* | 2/2014 | Widiger | G06F 17/5036 716/104 |
| 8,671,382 B2 | 3/2014 | Su et al. | |
| 8,799,839 B1* | 8/2014 | Tetelbaum | G06F 17/5031 716/108 |
| 2009/0077507 A1 | 3/2009 | Hou et al. | |
| 2011/0078642 A1* | 3/2011 | Elfadel | G06F 17/5036 716/106 |
| 2013/0007692 A1 | 1/2013 | Yeh et al. | |
| 2013/0179851 A1* | 7/2013 | Le | G06F 17/5031 716/108 |
| 2014/0282342 A1 | 9/2014 | Wu et al. | |
| 2016/0283643 A1* | 9/2016 | Kim | G06F 17/5081 |

OTHER PUBLICATIONS

Markovic, et al. "The Role of Post-Layout Verification in Microprocessor Design." Feb. 16, 2004. Retrieved from https://bib.irb.hr/datoteka/521186.MEET24.pdf.

Wikipedia.org. "Process Corners." Jun. 26, 2014. Retrieved from https://en.wikipedia.org/wiki/Process_corners.

Silvaco. "Hipex: Full-Chip Parasitic Extraction." Rev. 042413_23 Aug. 15, 2013.

Wikipedia.org. "Physical Design (Electronics)." Sep. 3, 2015. Retrieved from https://en.wikipedia.org/wiki/Physical_design_(electronics).

Mentor Graphics Corp. "Parasitic Extraction Challenges for Designing Advanced Process ICs." Sep. 22, 2015. Retrieved from http://www.soccentral.com/results.asp?CatID=488&EntryID=24680.

* cited by examiner

Fig. 5A     Fig. 5B

METHOD FOR ANALYZING INTERCONNECT PROCESS VARIATION

BACKGROUND

During the bulk manufacture of integrated circuits (ICs), semiconductor manufacturing processes are subject to process variation that may affect the operation of resulting IC chips. Additionally, as semiconductor manufacturing processes move towards smaller and smaller feature sizes, such as 28 nanometers and below, parasitic resistance-capacitance (RC) elements in interconnect structures of the ICs have an increasing effect on the operation of the resulting ICs chips. The process variation and the parasitic RC elements may negatively impact yields, as well as the performance and the reliability of the resulting IC chips, such that the ICs may be designed to account for process variation and parasitic RC elements using computer simulation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D illustrate the extraction and manipulation of data according to some embodiments of the method of FIG. 4.

DETAILED DESCRIPTION

Figure 1:
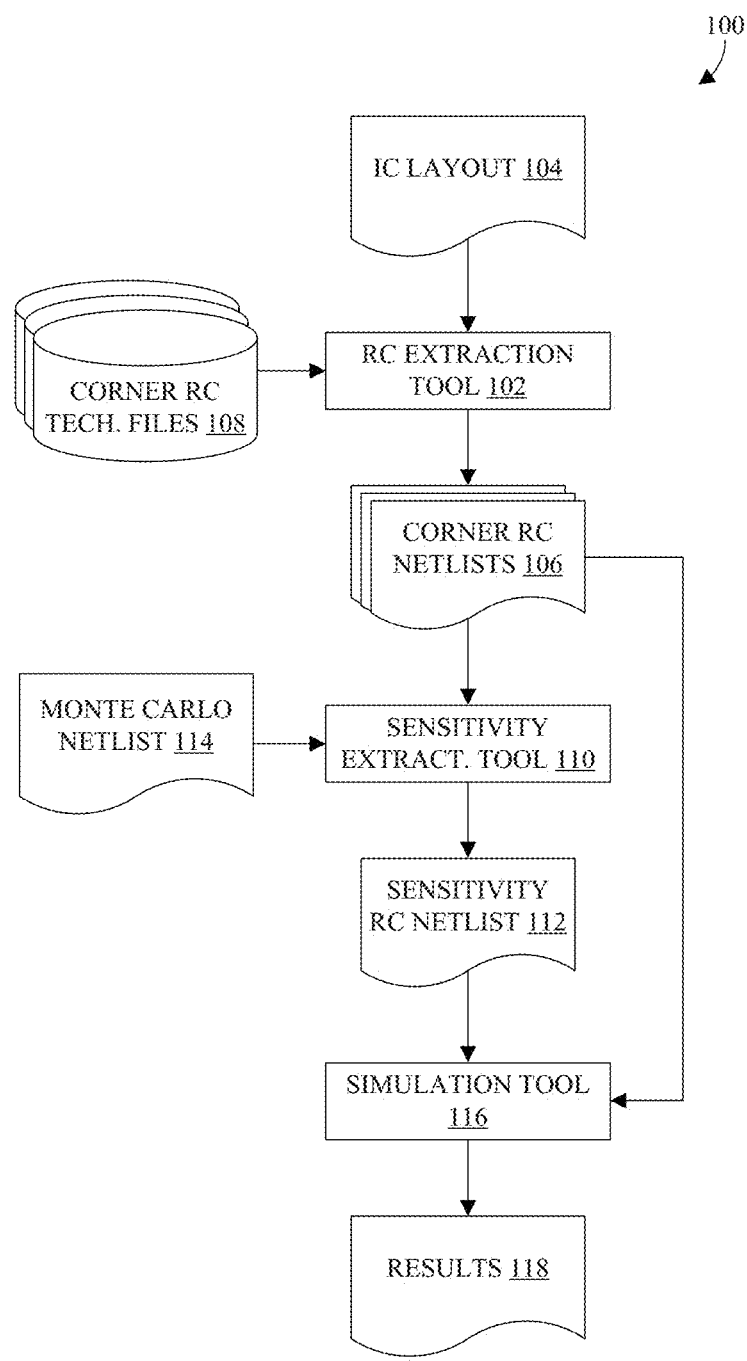
FIG. 1 illustrates a data flow diagram of some embodiments of a system for analyzing process variation and parasitic resistance-capacitance (RC) elements in an interconnect structure of an integrated circuit (IC).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The design process for integrated circuits (ICs) comprises the design of circuit schematics, the design of IC layouts for the circuit schematics, and verification that the circuit schematics and the IC layouts meet or exceed predetermined criteria. Often, verification uses computer simulations to verify that the ICs are tolerant of process variation, as well as parasitic resistance-capacitance (RC) elements in interconnect structures of the ICs. Failure to do so may result in low yields, and/or poor performing and/or unreliable IC chips during the bulk manufacture of the ICs.

One approach for verifying that an IC is tolerant of process variation and parasitic RC elements uses a Monte Carlo (MC) simulation. The MC simulation varies physical dimensions (e.g., width, height, and thickness) of an interconnect structure to generate new interconnect structures. RC extraction is then performed on the new interconnect structures using corresponding RC technology files to generate RC netlists, and simulation is performed using the RC netlists to predict the performance of the IC. However, this approach is computationally intensive, and dependent upon a large number of RC technology files.

Another approach for verifying that an IC is tolerant of process variation and parasitic RC elements uses simulations at process corners. RC extraction is performed on an interconnect structure of the IC using corner RC technology files at the process corners to generate corner RC netlists. Further, simulation is performed on the corner RC netlists to predict the performance of the IC at the process corners. However, this approach shifts the parasitic RC elements of individual corner RC netlists to the same process corner, without regard for inter-layer cancellation, and produces an overly pessimistic view of the IC performance.

Yet another approach for verifying that an IC is tolerant of process variation and parasitic RC elements uses the statistical relationship between physical parameters (e.g., width, height, and thickness) of conductive layers in an interconnect structure and the parasitic RC elements. RC extraction is performed on the interconnect structure using a statistical RC technology file representing this relationship to generate a statistical RC netlist. MC simulation is then performed varying the physical parameters and simulating the statistical RC netlist in accordance with the varied physical parameters to predict the performance of the IC. However, this approach is computationally intensive and has poor accuracy.

The present application is directed to a method and a corresponding system for analyzing process variation and parasitic RC elements. In some embodiments, corner RC netlists are generated for an interconnect structure of the IC. The corner RC netlists are generated by RC extraction at process corners of a semiconductor manufacturing process under consideration. Conductive layers of the interconnect structure are grouped and sensitivity values are determined group-by-group using the corner RC netlists. The sensitivities describe (i.e., quantify) how sensitive parasitic RC elements in the interconnect structure are to process variation at different process corners and different groups. The sensitivities are combined into a sensitivity RC netlist and a MC simulation is performed on the sensitivity netlist by varying the process corners of the groups and the process variation of the groups.

Advantageously, the method and the system of the present application accurately predict the operation of ICs. Further, the method and the system advantageously take into account inter-layer cancellation, and advantageously allow the best and worst case results to be predicted. Even more, process variation and process corner can advantageously be varied between groups of conductive layers.

With reference to FIG. 1, a data flow diagram 100 of some embodiments of a system for analyzing process variation and parasitic RC elements in a interconnect structure of an IC is provided. As illustrated, an RC extraction tool 102 is configured to perform RC extraction on a layout 104 of the IC to form corner RC netlists 106. The IC layout 104 describes the geometry of the IC, and the corner RC netlists 106 describe parasitic RC elements in the interconnect structure of the IC respectively at process corners. The process corners correspond to peripheral cases (e.g., extremes) of process variation for a semiconductor manufacturing process under consideration, as well as typical (e.g., mean) process variation of the semiconductor manufacturing process.

The RC extraction is performed on the IC layout 104 using corner RC technology files 108. The corner RC technology files 108 describe the geometries of interconnect structures formed at respective process corners by the semiconductor manufacturing process. Further, the corner RC technology files 108 describe parasitic RC elements in the respective interconnect structures. In some embodiments, during the RC extraction, the parasitic RC elements are extracted from the corner RC technology files 108 by matching geometric patterns found in the interconnect structure of the IC to corresponding geometric patterns found in the interconnect structures of the corner RC technology files 108.

A sensitivity extraction tool 110 is configured to perform sensitivity extraction on the corner RC netlists 106 to generate a sensitivity RC netlist 112 comprising sensitivity values. The sensitivity values describe, for different process corners, how sensitive parasitic RC elements in the interconnect structure of the IC are to process variation of the semiconductor manufacturing process. The sensitivity RC netlist 112 combines the sensitivity values to define the parasitic RC elements as a function of process corner and process variation. During the sensitivity extraction, the sensitivity values are respectively calculated for conductive layers and/or for groups of conductive layers in the interconnect structure of the IC, and subsequently combined per layer or group into the sensitivity RC netlist 112.

In some embodiments, the sensitivity extraction tool 110 is further configured to incorporate a MC netlist 114 into the sensitivity RC netlist 112. The MC netlist 114 defines parameters of the sensitivity RC netlist 112, such as process corner and process variation parameters for each of the conductive layers or groups of conductive layers.

A simulation tool 116 is configured to randomly generate vectors of values (i.e., MC samples) for a vector of parameters (e.g., process corner and process variations parameters) in the sensitivity netlist. The MC samples are generated according to respective definitions of the parameters in the MC netlist 114 and, in some embodiments, according to the known probability distributions of the parameters. Using the MC samples, the simulation tool 116 is configured to perform computer simulations on the individual MC samples to predict the performance of the IC at the MC samples. Further, in some embodiments, the simulation tool 116 is configured to perform simulation on the corner RC netlists to predict the performance of the IC at the process corners. The results 118 may then be analyzed to assess whether the IC is tolerant of process variation and parasitic RC elements in the interconnect structure of the IC.

Advantageously, the system accurately predicts the operation of the IC. Further, the system advantageously takes into account inter-layer cancellation, and advantageously allows the best and worst case results to be predicted. Even more, process variation and process corner can advantageously be varied between conductive layers or groups of conductive layers.

The RC extraction tool 102, the sensitivity extraction tool 110, the simulation tool 116, or any combination of the foregoing tools 102, 110, 116 may be implemented in hardware, software, or a combination of the two. For example, a tool 102, 110, 116 may comprise a microcontroller, a processor, an application-specific integrated circuit (ASIC), or the like implementing the respective functionality. As another example, a tool 102, 110, 116 may comprise a memory, such as FLASH memory, storing software and one or more processors, such as a microprocessor, configured to execute the software to perform the respective functionality of the tool 102, 110, 116. Further, the corner RC technology files 108, the corner RC netlists 106, the sensitivity RC netlist 112, the MC netlist 114, the simulation results 118, or any combination of the foregoing data may be stored on a memory, such as FLASH memory, random access memory (RAM), or the like.

Figure 2:
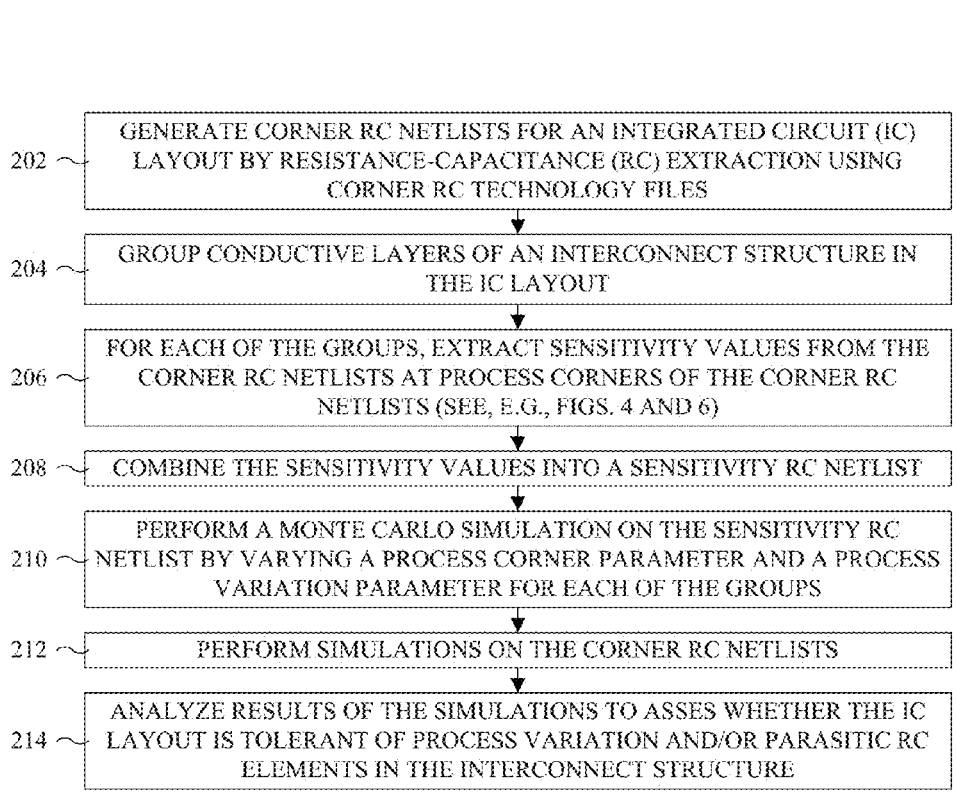
FIG. 2 illustrates a flowchart of some embodiments of a method for analyzing process variation and parasitic RC elements in an interconnect structure of an IC.

With reference to FIG. 2, a flowchart 200 describes some embodiments of a method for analyzing process variation and parasitic RC elements in a interconnect structure of an IC. In some embodiments, the method is performed by the system of FIG. 1.

As illustrated, corner RC netlists are generated at 202 for a layout of the IC. The corner RC netlists describe parasitic RC elements in an interconnect structure of the IC respectively at process corners. Further, in some embodiments, the corner RC netlists describe node layer, node position, segment width, and via area information at the process corners. The process corners correspond to peripheral cases (e.g., extremes) of process variation for a semiconductor manufacturing process under consideration, as well as typical (e.g., mean) process variation of the semiconductor manufacturing process. The parasitic RC elements comprise parasitic resistance elements corresponding to conductive features, such as metal lines, in the interconnect structure of the IC. Further, the parasitic RC elements comprise parasitic capacitance elements between the conductive features and ground and between neighboring conductive features in the interconnect structure of the IC.

In some embodiments, the corner RC netlists comprise five RC netlists at individual process corners. The process corners comprise a typical process corner and peripheral process corners. The typical process corner may, for example, correspond to process variation that achieves typical or nominal net resistance and typical or nominal net capacitance in the interconnect structure of the IC. The peripheral process corners comprise a cbest process corner, a cworst process corner, a rcbest process corner, and a rcworst process corner. The cbest process corner may, for example, correspond to process variation that achieves minimum net capacitance and maximum net resistance in the interconnect structure of the IC. The cworst process corner may, for example, correspond to process variation that achieves maximum net capacitance and minimum net resistance in the interconnect structure of the IC. The rcbest process corner may, for example, correspond to process variation that achieves minimum net resistance and maximum net capacitance in the interconnect structure of the IC. The rcworst process corner may, for example, correspond to process variation that achieves maximum net resistance and minimum net capacitance in the interconnect structure of the IC.

To generate the corner RC netlists, RC extraction is performed using corner RC technology files for the process corners. The corner RC technology files describe the geometries of interconnect structures (e.g., a five or nine layer interconnect structure) formed at the respective process corners by the semiconductor manufacturing process. Further, the corner RC technology files describe parasitic RC elements in the respective interconnect structures. In some embodiments, during the RC extraction for a process corner, the interconnect structure of the IC is divided into geometric profiles or patterns. The geometric profiles or patterns of the IC are matched to corresponding geometric profiles or patterns in the corner RC technology file for the process corner. Further, the parasitic RC elements of the matching geometric profiles or patterns are extracted from the corner RC technology file and applied to the corresponding geometric profiles or patterns in the IC.

In some embodiments, conductive layers of the interconnect structure are grouped at 204. For example, the conductive layers of a middle of line (MOL) region and/or a front end of line (FEOL) may be grouped into a common group, a first metal layer of a back end of line (BEOL) region may be its own group, and subsequent metal layers of the BEOL region may be grouped with respective via layers that immediately underlie the metal layers.

Thereafter, sensitivity values are extracted at 206 for each conductive layer or each group of conductive layers in the interconnect structure. The sensitivity values describe how sensitive parasitic RC elements in the interconnect structure of the IC are to process variation at the individual process corners. While discussed in greater detail hereafter, the sensitivity extraction for a conductive layer or group of conductive layers comprises numerical analysis on the resistance and capacitance values of the parasitic RC elements in the conductive layer or group. The numerical analysis decomposes the resistance and capacitance values into components, such as, for example, linearly uncorrelated components, corresponding to the sensitivity values. The numerical analysis comprises, for example, principal component analysis (PCA) and singular value decomposition (SVD).

The sensitivity values are combined at 208 into a sensitivity RC netlist. The sensitivity RC netlist describes, for each conductive layer or group, the parasitic RC elements of the conductive layer or group as a function of process corner and as a function of process variation. Further, in some embodiments, the sensitivity RC netlist further describes, for each conductive layer or group, the parasitic RC elements as a function of resistance variation and/or a capacitance variation. The resistance and capacitance variation identify variation for parasitic RC elements in respective conductive layers and/or groups, and hence represent local variation within a conductive layer or group. In combining the sensitivity values, one of the corner RC netlists at a typical process corner (e.g., a process corner with typical or mean process variation) is used as a baseline and the sensitivity values and the parameters are used to define offsets from corresponding baseline values.

A MC simulation is performed at 210 on the sensitivity RC netlist. Vectors of values are randomly generated for a vector of parameters in the sensitivity netlist. The MC samples are generated according to respective definitions of the parameters in a MC netlist and, in some embodiments, according to the known probability distributions of the parameters. The parameters include a process corner parameter and a process variation parameter for each of the conductive layers and/or the groups. The process corner parameters identify process corners for respective conductive layers and/or groups, and the process variation parameters identify process variation of the semiconductor manufacturing process for respective conductive layers and/or groups. In some embodiments, the parameters further include a resistance variation parameter and/or a capacitance variation parameter for each of the conductive layers and/or the groups. The resistance and capacitance variation parameters respectively identify process variation for parasitic resistance elements and parasitic capacitance elements in respective conductive layers and/or groupings, and hence represent local (i.e., intra-layer) process variation.

The parameters of the sensitivity RC netlist are populated with values of the MC samples and computer simulations are performed on the populated sensitivity RC netlists to predict the performance of the IC at the MC samples. Further, in some embodiments, computer simulations are additionally performed at 212 on the corner RC netlists to predict the performance of the IC at the process corners. The computer simulations may, for example, be employed to predict signal propagation through the interconnect structure and/or timing delays of signals traversing the interconnect structure. Further, the computer simulations may be performed using, for example, Simulation Program with Integrated Circuit Emphasis (SPICE).

The results of the computer simulations are next analyzed at 214 to assess whether the IC is tolerate of process variation and/or parasitic RC elements in the interconnect structure of the IC. In some embodiments, analysis comprises calculating yield (i.e., a percentage of the MC samples that meet predetermined criteria). In other embodiments, the analysis comprises checking for hold failures with flip flops using timing delays of signals traversing the interconnect structure. In yet other embodiments, the analysis comprises the identification of process corners that achieve the best and worst results.

While the disclosed method (e.g., the method described by the flowchart 200) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 3A:
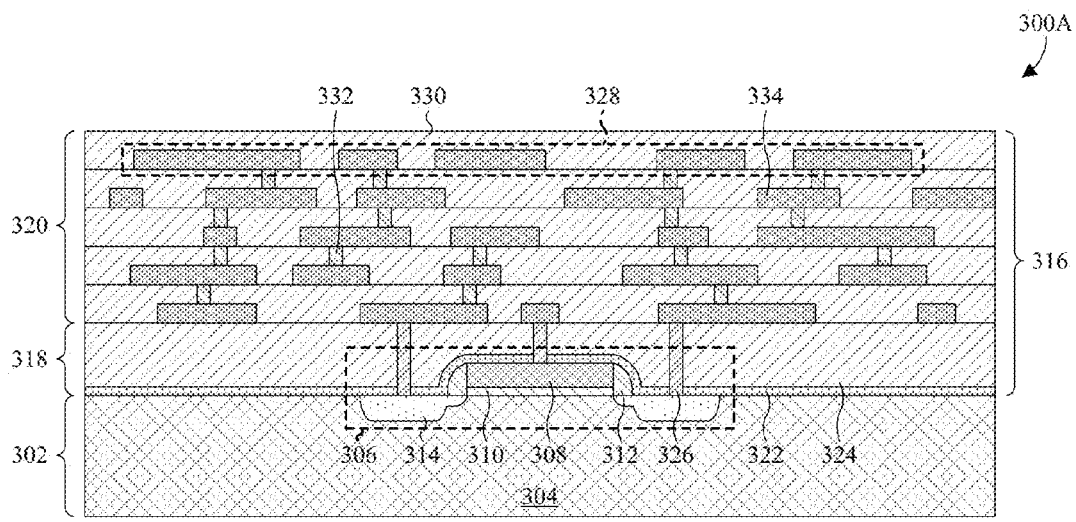
FIG. 3A illustrates a cross-sectional view of some embodiments of an IC layout for use with the method of FIG. 2.

With reference to FIG. 3A, a cross-sectional view 300A of some embodiments of an IC layout is provided. The IC layout may, for example, correspond to the IC layout 104 of FIG. 1, and/or may be used within the method of FIG. 2. As illustrated, the IC layout comprises a FEOL region 302. The FEOL region 302 comprises a semiconductor substrate 304 with an electronic device 306 arranged on an upper side of the semiconductor substrate 304. The electronic device 306 may be, for example, a transistor, a capacitor, a diode, a memory cell, or the like. In some embodiments where the electronic device 306 is transistor, the electronic device 306 may comprise a gate electrode 308 arranged over and spaced from the semiconductor substrate 304 by a gate dielectric layer 310. Further, the electronic device 306 may comprise one or more spacers 312 arranged on opposing sides of the gate electrode 308 and source/drain regions 314 arranged in the semiconductor substrate 304 respectively on the opposing sides.

An interconnect structure 316 is arranged over the FEOL region 302. The interconnect structure 316 comprises a MOL region 318 and a BEOL region 320 arranged over the MOL region 318. The MOL region 318 comprises a contact etch stop layer 322 covering the electronic device 306, an MOL interlayer dielectric (ILD) layer 324 arranged over the contact etch stop layer 322, and contacts 326 extending through the MOL ILD layer 324 and the contact etch stop layer 322 to terminals of the electronic device 306. The BEOL region 320 comprises conductive layers 328 stacked within BEOL ILD layers 330 and interconnected by vias 332 extending through the BEOL ILD layers 330. The conductive layers 328 comprise conductive features 334, such as metal lines and bond pads. In some embodiments, the BEOL region 320 comprises 9 conductive layers of a first metal, such as aluminum copper or copper, and a topmost conductive layer of a second metal, such as aluminum.

During the sensitivity extraction of FIGS. 1 and 2, conductive layers of the MOL region 318 and, in some embodiments, the FEOL region 302 may be define a single group. Further, each conductive layer 328 of the BEOL region 320 and the corresponding vias 332 immediately below the conductive layer 328 may define a group. For example, a topmost conductive layer and the vias immediately below the topmost conductive layer may define a group. As another example, a first conductive layer and the vias immediately below the first conductive layer may define a second group.

Figure 3B:
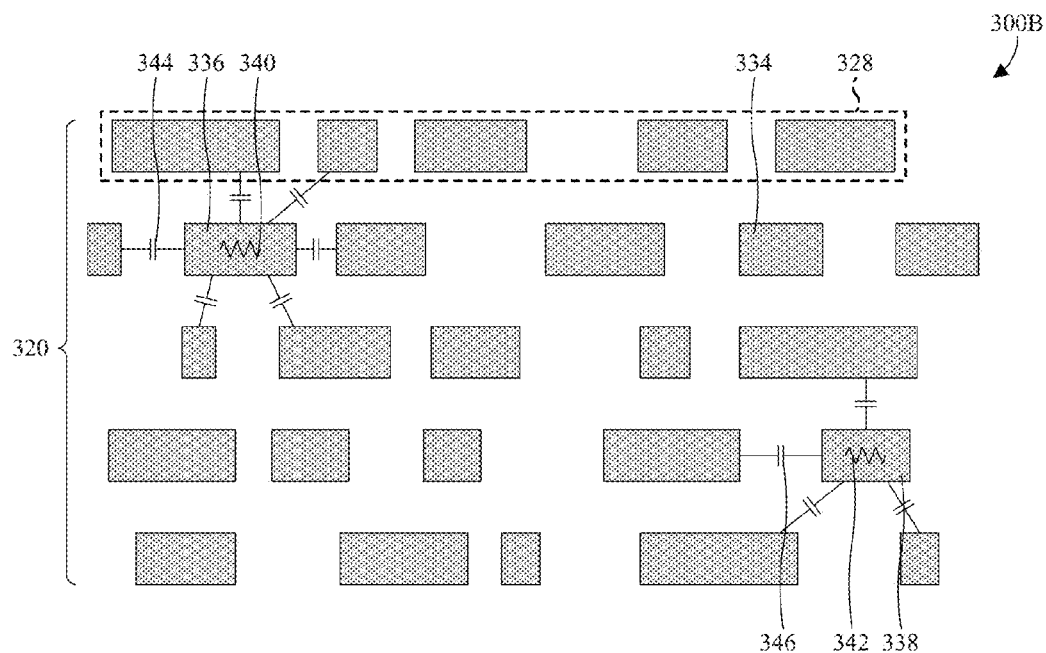
FIG. 3B illustrates a cross-sectional view of some embodiments of back end of line (BEOL) region of FIG. 3A in which parasitic RC elements have been added.

With reference to FIG. 3B, a cross-sectional view 300B of some embodiments of the BEOL region 320 of FIG. 3A is provided. The cross-sectional view 300B is scaled relative to the cross-sectional view 300A and omits the BEOL ILD layers 330 and the vias 332. As illustrated, two conductive features 336, 338 in the BEOL region 320 are annotated with corresponding parasitic RC elements, such as parasitic resistance elements 340, 342 and parasitic capacitance elements 344, 346. A first conductive feature 336 comprises a first parasitic resistance element 340 and is associated with first parasitic capacitance elements 344 between it and other conductive features. Similarly, a second conductive feature 338 comprises a second parasitic resistance element 342 and is associated with second parasitic capacitance elements 346 between it and other conductive features.

Figure 4:
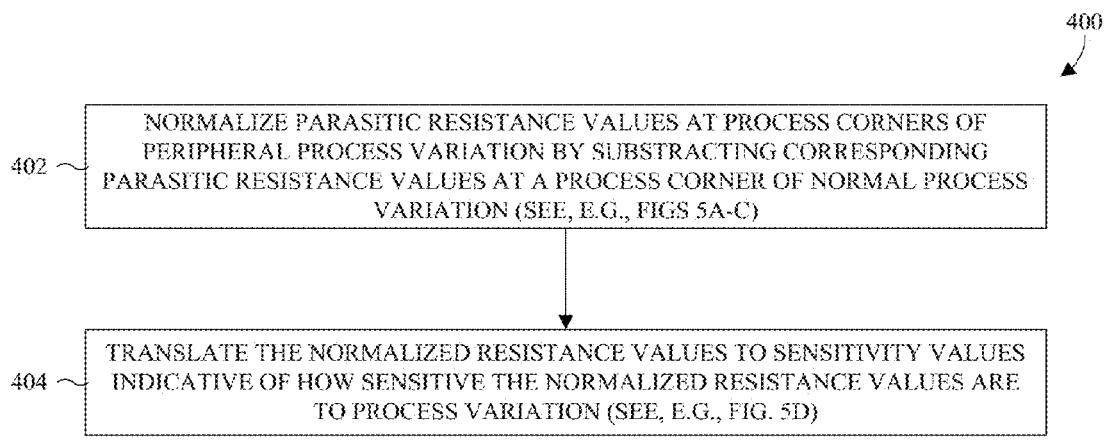
FIG. 4 illustrates a flowchart of some embodiments of a method for performing sensitivity extraction on parasitic resistance elements.

With reference to FIG. 4, a flowchart 400 of some embodiments of a method for extracting sensitivity values of parasitic resistance elements in corner RC netlists is provided. The method may, for example, be performed within the system of FIG. 1 and/or the method of FIG. 2. As illustrated, resistance values of the parasitic resistance elements that are at process corners of peripheral (e.g., extreme) process variation are normalized at 402 by subtracting corresponding resistance values at a process corner of normal process variation. For example, the resistance values at cworst, cbest, rcworst, and rcbest process corners are normalized by subtracting corresponding resistance values at a typical process corner. The resistance values are obtained from the corner RC netlists at the corresponding process corners.

Having normalized the resistance values at 402, the normalized resistance values are translated (e.g., decomposed) at 404 into corresponding sensitivity values. The sensitivity values describe how sensitive the corresponding resistance values are to process variation at respective process corners. In some embodiments, the translation is individually performed on each conductive feature, such as each metal line, in the interconnect structure of the corner RC netlists. Further, in some embodiments, the translation is performed using PCA or SVD, such that the sensitivity values may, for example, correspond to translations of the normalized resistance values to a coordinate system of linearly uncorrelated dimensions.

While the disclosed method (e.g., the method described by the flowchart 400) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 5C:
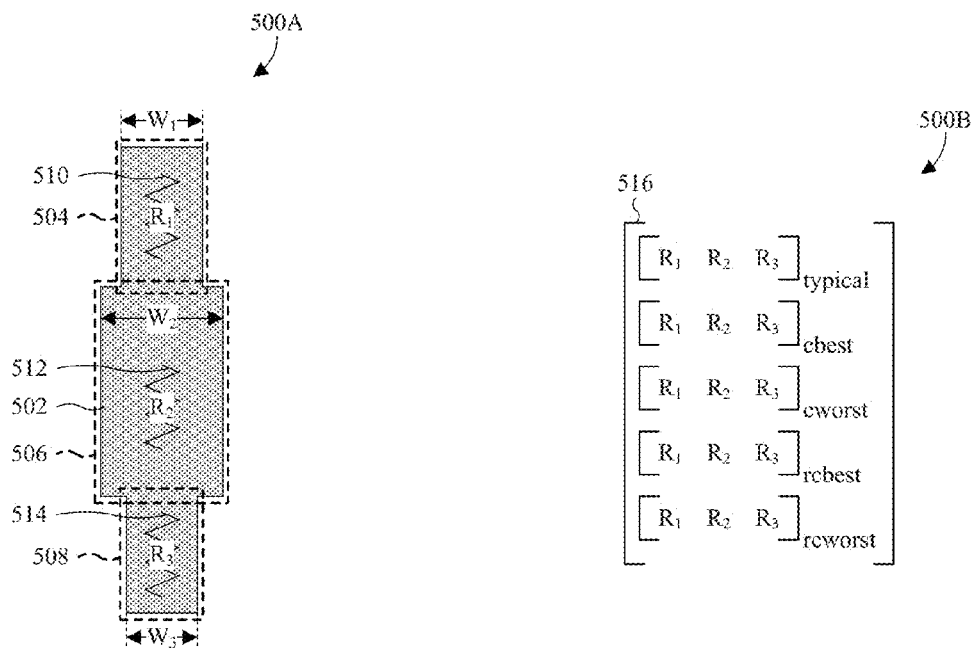
Figure 5C:
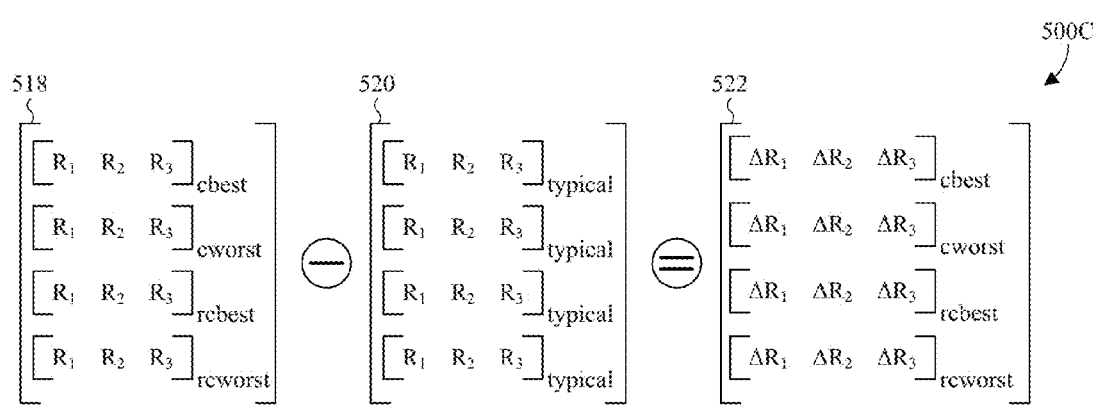
Figure 5D:
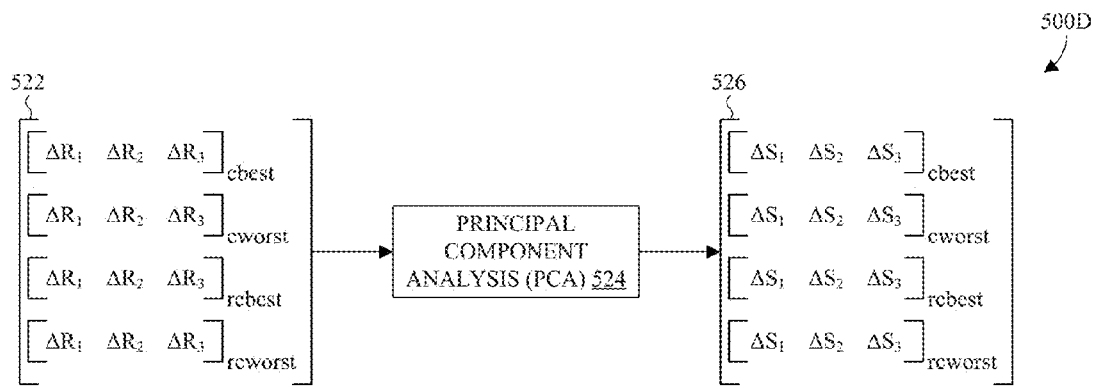

With reference to FIGS. 5A-5D, a series of illustrations 500A-500D are provided to illustrate some embodiments of the method of FIG. 4 for a single conductive feature in an interconnect structure of an IC. FIGS. 5A-5C are presented to illustrate 402 of FIG. 4, and FIG. 5D is presented to illustrate 404 of FIG. 4. Although FIGS. 5A-5D are described in relation to the method, it will be appreciated that FIGS. 5A-5D are not limited to the method, but instead may stand alone. Similarly, although the method is described in relation to FIGS. 5A-5D, it will be appreciated that the method is not limited to the FIGS. 5A-5D, but instead may stand alone.

As illustrated by FIG. 5A (e.g., corresponding to 402 of FIG. 4), a top view 500A of some embodiments of a conductive feature 502 (e.g., a metal line) is provided. The conductive feature 502 comprises one or more segments (i.e., regions) 504, 506, 508, each comprising a parasitic resistance element 510, 512, 514. For example, the conductive feature 502 may comprise: a first segment 504 that has a first parasitic resistance element 510 with a first resistance value $R_1$; a second segment 506 that has a second parasitic resistance element 512 with a second resistance value $R_2$; and a third segment 508 that has a third parasitic resistance element 514 with a third resistance value $R_3$. The segment(s) 504, 506, 508 are defined during the generation of corner RC technology files and are arranged end to end in the direction of current flow. In some embodiments, the segment(s) 504, 506, 508 are delineated by changes in direction and/or width of the conductive feature 502. For example, the segment(s) 504, 506, 508 may have respective width values $W_1, W_2, W_3$ that delineate the segment(s) 504, 506, 508.

As illustrated by FIG. 5B (e.g., corresponding to 402 of FIG. 4), resistance values (e.g., $R_{1,cbest}$) at different process corners, and for the parasitic resistance element(s) 510, 512, 514 of FIG. 5A, are arranged in a matrix 516. In some embodiments, rows correspond to process corners of a semiconductor manufacturing process and columns correspond to resistance values for the parasitic resistance element(s) 510, 512, 514. Further, in some embodiments, the rows correspond to typical, cbest, cworst, rcbest, and rcworst process corners. The resistance values may be extracted from corner RC netlists of the IC.

As illustrated by FIG. 5C (e.g., corresponding to 402 of FIG. 4), resistance values (e.g., $R_{1,cbest}$) at process corners of peripheral process variation are normalized by subtracting corresponding resistance values (e.g., $R_{1,typical}$) at a process corner of typical process variation. In some embodiments, the process corners of peripheral process variation comprise cbest, cworst, rcbest, and rcworst process corners. Further, in some embodiments, the normalized resistance values are calculated using matrix subtraction. For example, the resistance values at process corners of peripheral process variation are arranged in a first matrix 518 with rows corresponding to the process corners and columns corresponding to the parasitic resistance element(s) 510, 512, 514 of FIG. 5A. Further, the resistance values at the process corner of typical process variation are arranged in a second matrix 520 with the same size as the first matrix and with columns corresponding to the parasitic resistance element(s) 510, 512, 514. In doing so, the resistance values at the process corner of typical process variation are repeated for each row of the second matrix 520. With the first and second matrices 518, 520, the second matrix 520 is subtracted from the first matrix 518 element-by-element to form a third matrix 522 of normalized resistance values (e.g., $\Delta R_{1,cbest}$).

As illustrated by FIG. 5D (e.g., corresponding to 404 of FIG. 4), a numerical analysis technique 524 is applied to the normalized resistance values (e.g., $\Delta R_{1,cbest}$) to decompose the normalized resistance values into corresponding sensitivity values (e.g., $\Delta S_{1,cbest}$). For example, PCA or SVD may be applied to the normalized resistance values. The sensitivity values describe how sensitive the normalized resistance values are to process variation, and may be, for example, arranged in a matrix 526 with rows corresponding to process corner and columns corresponding the parasitic resistance elements 510, 512, 514 of FIG. 5A.

During use of the sensitivity values (e.g., during MC simulation), a resistance value for a parasitic resistance element 510, 512, 514 of FIG. 5A may be calculated as a function of a process corner parameter and a process variation parameter. The process corner parameter identifies a process corner of peripheral process variation, such as the cbest process corner, and the process variation parameter identifies the extent of process variation. For example, a sensitivity value (e.g., $\Delta S_{1,cbest}$) may be selected for the parasitic resistance element using a value of the process corner parameter. The selected sensitivity value may then be multiplied by the value of the process variation parameter or a derivative of the process variation parameter value, and the product may be subtracted from a typical value of the parasitic resistance element (e.g., $R_{1,typical}$). The derivative may, for example, be calculated using a linear function that returns the derivative as a function of the process variation parameter.

Figure 6:
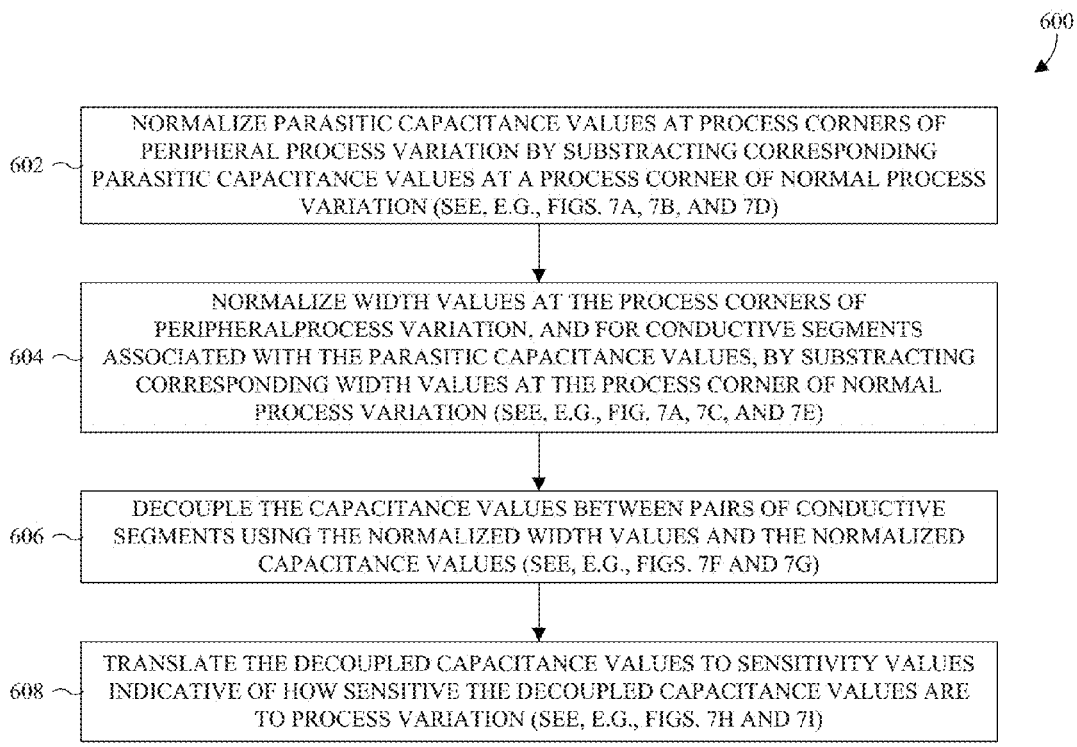
FIG. 6 illustrates a flowchart of some embodiments of a method for performing sensitivity extraction on parasitic capacitance elements.

With reference to FIG. 6, a flowchart 600 of some embodiments of a method for extracting sensitivity values of parasitic capacitance elements in corner RC netlists is provided. The method may, for example, be performed within the system of FIG. 1 and/or the method of FIG. 2. As illustrated, capacitance values of the parasitic capacitance elements that are at process corners of peripheral (e.g., extreme) process variation are normalized at 602 by subtracting corresponding parasitic capacitance values at a process corner of normal process variation. The capacitance values are obtained from the corner RC netlists at the corresponding process corners.

Further, width values for segments associated with the parasitic capacitance elements, and that are at the process corners of peripheral process variation, are normalized at 604 by subtracting corresponding width values at the process corner of normal process variation. The segments are regions of conductive features, such as metal lines, in an interconnect structure of an IC, and are defined during the generation of corner RC technology files. The width values are obtained from the corner RC netlists at the corresponding process corners.

Having normalized the capacitance and width values at 602 and 604, the normalized capacitance values between pairs of capacitively-coupled segments are decoupled at 606 for the individual process corners of peripheral process variation. Each pair of capacitively-coupled segments comprises a victim and an aggressor that induces noise in the victim. The designations (i.e., victim or aggressor) for the pairs of capacitively-coupled segments may be extracted from the corner RC netlists, and may vary for different pairs (i.e., a segment may be a victim in one pair and an aggressor in another pair). The decoupling apportions the normalized capacitance values between the capacitively-coupled segments of corresponding pairs in accordance with the normalized width values of the segments. For example, for a victim of a pair, the victim is assigned a portion of a normalized capacitive value from the victim to the aggressor that is inversely proportional to the width value of the victim, and is further assigned a portion of a capacitive value extending from the aggressor to the victim that is proportional to the width value of the victim. The converse holds for the aggressor of the pair.

The decoupled capacitance values are translated (e.g., decomposed) at 608 into corresponding sensitivity values. The sensitivity values describe how sensitive the corresponding decoupled capacitance values are to process variation. In some embodiments, the translation is individually performed on each pair of capacitively-coupled segments. Further, in some embodiments, the translation is performed using PCA or SVD.

While the disclosed method (e.g., the method described by the flowchart 600) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 7A:
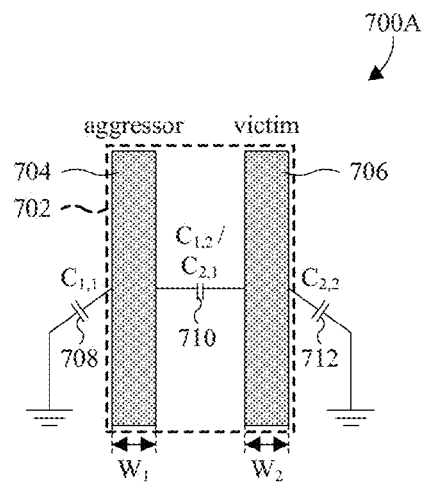
FIGS. 7A-7I illustrate the extraction and manipulation of data according to some embodiments of the method of FIG. 6.
Figure 7B:
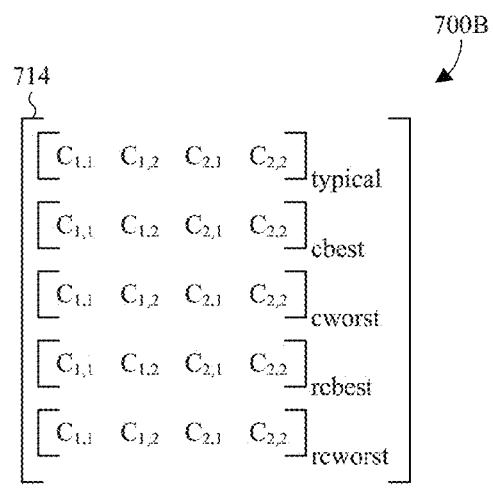
Figure 7C:
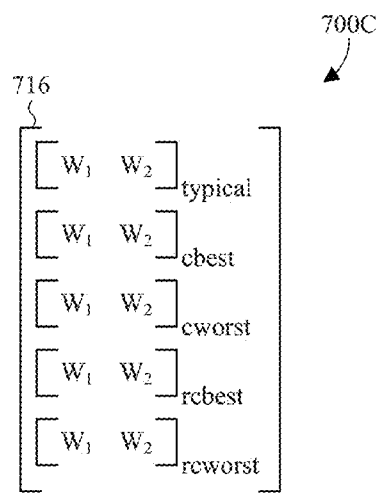
Figure 7D:
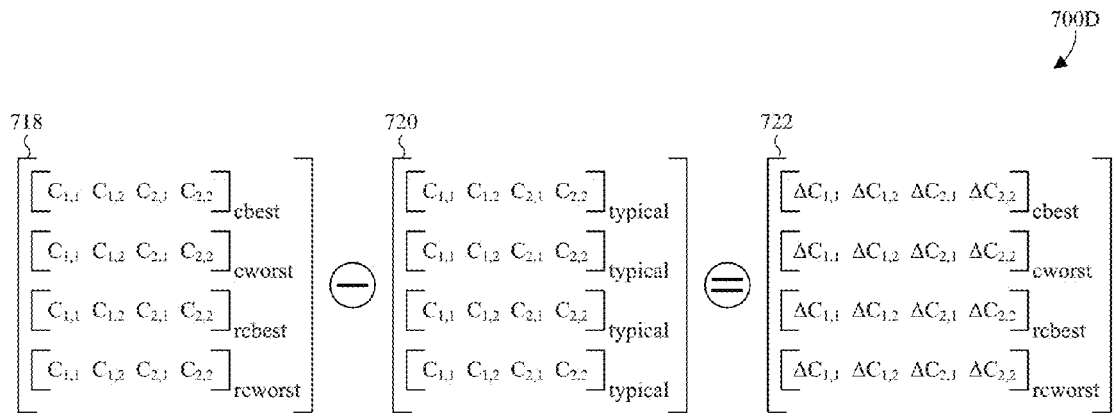
Figure 7E:
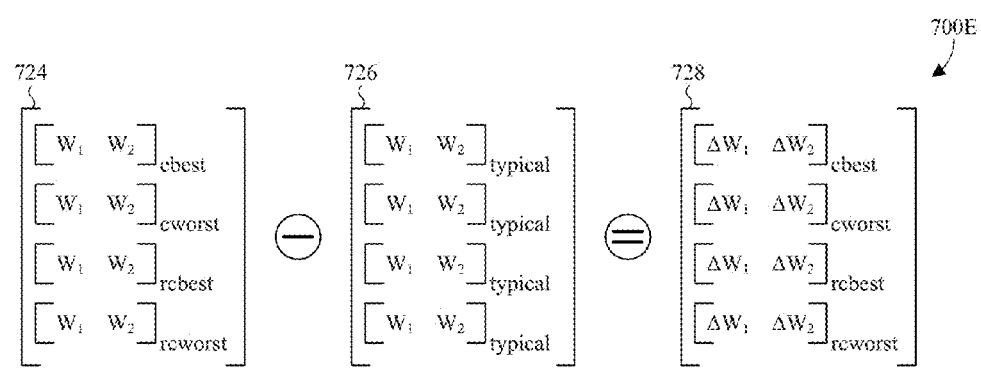
Figure 7F:
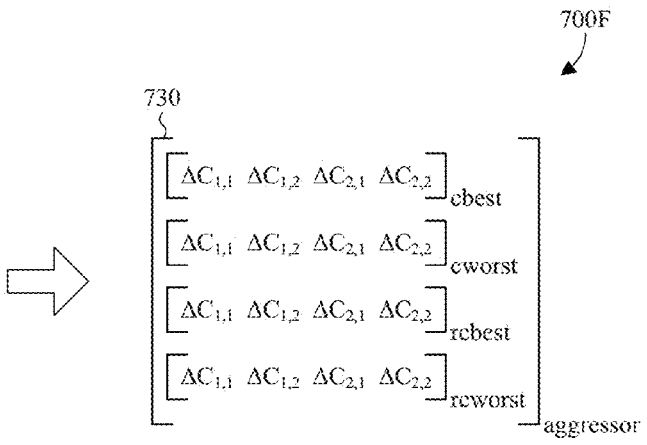
Figure 7G:
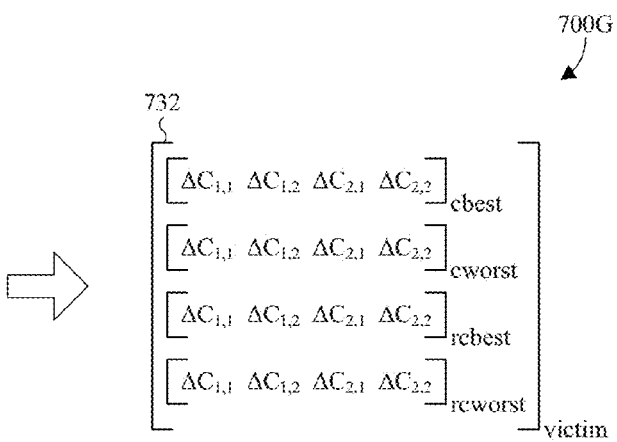
Figure 7H:
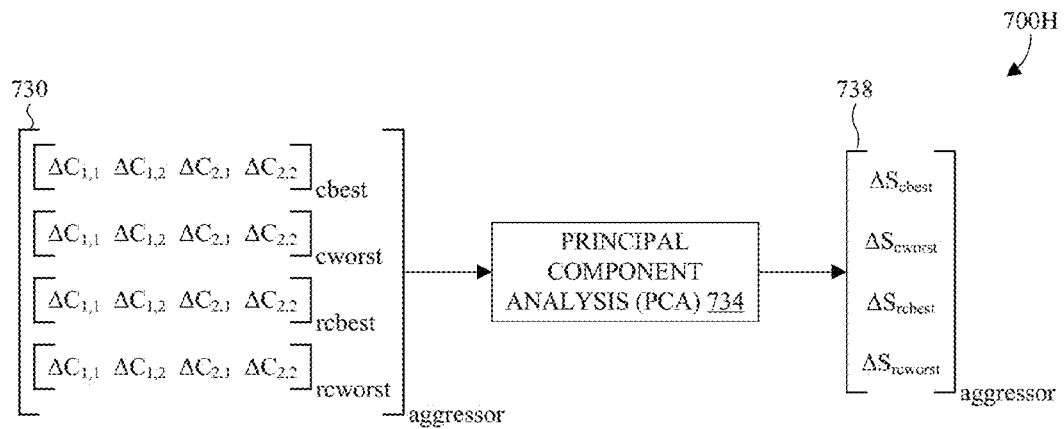
Figure 7I:
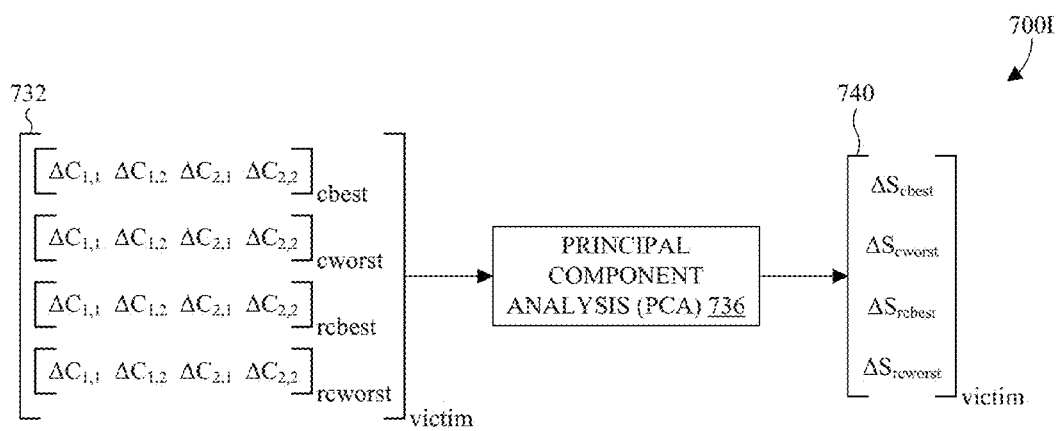

With reference to FIGS. 7A-7I, a series of illustrations 700A-700I are provided to illustrate some embodiments of the method of FIG. 6 for a single pair of capacitively coupled segments in an interconnect structure of an IC. FIGS. 7A, 7B, & 7D are presented to illustrate 602 of FIG. 6, FIGS. 7A, 7C & 7E are presented to illustrate 604 of FIG. 6, FIGS. 7F & 7G are presented to illustrate 606 of FIG. 6, and FIGS. 7H & 7I are presented to illustrate 608 of FIG. 6. Although FIGS. 7A-7I are described in relation to the method, it will be appreciated that FIGS. 7A-I are not limited to the method, but instead may stand alone. Similarly, although the method is described in relation to FIGS. 7A-7I, it will be appreciated that the method is not limited to the FIGS. 7A-I, but instead may stand alone.

As illustrated by FIG. 7A (e.g., corresponding to 602 and 604 of FIG. 6), a top view 700A of some embodiments of a pair 702 of capacitively-coupled segments is provided. The pair 702 of capacitively-coupled segments comprises an aggressor 704 and a victim 706. The aggressor 704 has a width value $W_1$ and the victim 706 has a width value $W_2$. Further, the aggressor 704 and the victim 706 are associated with parasitic capacitance elements 708, 710, 712 with capacitance values $C_{1,1}$, $C_{1,2}$, $C_{2,1}$, and $C_{2,2}$. The aggressor 704 and the victim 706 may be part of larger conductive features, such as metal lines, and are defined during the generation of corner RC technology files.

As illustrated by FIG. 7B (e.g., corresponding to 602 of FIG. 6), capacitance values at different process corners, and for the pair 702 of capacitively-coupled segments of FIG. 7A, are arranged in a capacitance matrix 714. In some embodiments, each row comprises a vector of capacitance values for the pair 702 at a respective process corner. Further, in some embodiments, the rows correspond to typical, cbest, cworst, rcbest, and rcworst process corners. The capacitance values may be extracted from corner RC netlists of the IC.

As illustrated by FIG. 7C (e.g., corresponding to 604 of FIG. 6), width values at different process corners, and that are for the pair 702 of capacitively-coupled segments in FIG. 7A, are arranged in a width matrix 716. In some embodiments, each row comprises a vector of width values for the pair 702 at a respective process corner. Further, in some embodiments, the rows correspond to the same process corners as the capacitance matrix. The width values may be extracted from corner RC netlists of the IC.

As illustrated by FIG. 7D (e.g., corresponding to 602 of FIG. 6), capacitance values (e.g., $C_{1,1,cbest}$) at process corners of peripheral process variation are normalized by subtracting corresponding capacitance values (e.g., $C_{1,1,typical}$) at a process corner of typical process variation. In some embodiments, the process corners of extreme process variation comprise cbest, cworst, rcbest, and rcworst process corners. Further, in some embodiments, the normalized capacitance values are calculated using matrix subtraction. For example, the difference between a first capacitance matrix 718 with capacitance values of peripheral process variation and a second capacitance matrix 720 with capacitance values of typical process variation is calculated to determine a third capacitance matrix 722 with normalized capacitance values (e.g., $\Delta C_{1,1,cbest}$).

As illustrated by FIG. 7E (e.g., corresponding to 604 of FIG. 6), width values (e.g., $W_{1,cbest}$) at the process corners of peripheral process variation are normalized by subtracting corresponding width values (e.g., $W_{1,typical}$) at the process corner of typical process variation. For example, the difference between a first width matrix 724 with width values at the process corners of peripheral process variation and a second width matrix 726 with width values at the process corner of typical process variation is calculated to determine a third width matrix 728 with normalized width values (e.g., $\Delta W_{1,cbest}$).

As illustrated by FIGS. 7F & 7G (e.g., corresponding to 606 of FIG. 6), the normalized capacitances shared by the victim 706 and the aggressor 704 in FIG. 7A are decoupled (i.e., split) based on width values for the process corners of peripheral process variation (generically referenced by subscript pc in FIGS. 7F & 7G). FIG. 7F is directed towards the decoupling of capacitances for the aggressor 704 and results in a decoupled matrix 730 of decoupled capacitance values (e.g., $\Delta C_{1,1,cbest,aggressor}$) for the aggressor 704. FIG. 7G is directed towards the decoupling of capacitances for the victim 706 and results in a decoupled matrix 732 of decoupled capacitance values (e.g., $\Delta C_{1,1,cbest,victim}$) for the victim 706.

As illustrated by FIGS. 7H & 7I (e.g., corresponding to 608 of FIG. 6), the decoupled capacitance values for the aggressor 704 and the victim 706 in FIG. 7A are respectively applied to numerical analysis techniques 734, 736 to decompose the decoupled capacitance values into corresponding sensitivity values (e.g., $\Delta S_{cbest,aggressor}$ and $\Delta S_{cbest,victim}$). For example, PCA or SVD may be applied to the decoupled matrices 730, 732. The sensitivity values describe how sensitive the decoupled capacitances values are to process variation, and may be, for example, arranged in sensitivity matrices 738, 740 with rows corresponding to process corners.

During use of the sensitivity values (e.g., during MC simulation), a capacitance value for a parasitic capacitance element 708, 710, 712 of the pair 702 of capacitively-coupled segments in FIG. 7A may be calculated as a function of a process corner parameter and a process variation parameter. For example, the victim/aggressor designation and the sensitivity values (e.g., $\Delta S_{cbest,aggressor}$) may be selected for the pair 702 using a value for the process corner parameter. The sensitivity values may then be multiplied by respective width ratios, and the products may be subtracted from a typical value for the parasitic resistance element (e.g., $C_{1,1,typical}$). The width ratios correspond to ratios of the victim and the aggressor width values relative to typical width values for the victim and the aggressor. Further, the victim and the aggressor width values are determined by a predetermined linear function that describes the width values as a function of the value for the process variation parameter.

Figure 8:
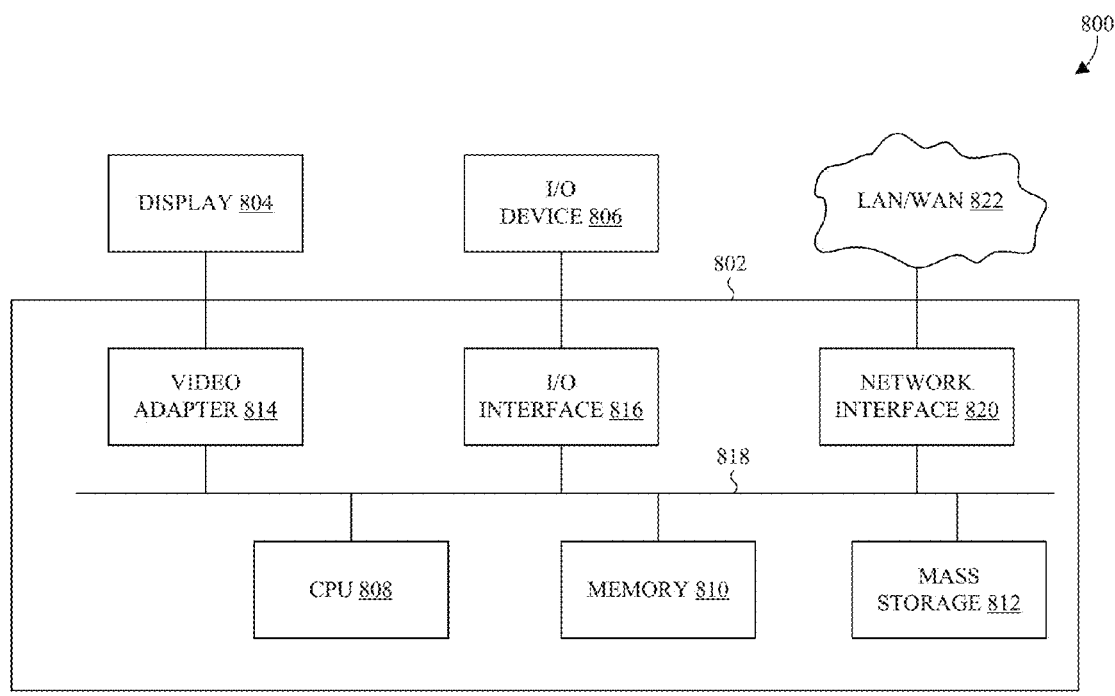
FIG. 8 illustrates a block diagram of some embodiments of a processor-based system for analyzing process variation and parasitic RC elements in an interconnect structure of an IC.

With reference to FIG. 8, a block diagram 800 of some embodiments of a process-based system for analyzing process variation and parasitic RC elements in an interconnect structure of an IC is provided. The foregoing methods (e.g., the methods of FIGS. 2, 4, and 6) may be implemented using computer program code in one or more general purpose computer or processor based system. As illustrated by FIG. 8, the processor based system is a general purpose computer platform and may be used to implement processes discussed herein. The processor based system may include a processing unit 802, such as a desktop computer, a workstation, a laptop computer, or a dedicated unit customized for a particular application. Further, the processor based system may be equipped with a display 804 and one or more input/output (I/O) devices 806, such as a mouse, a keyboard, or printer.

The processing unit 802 may include a central processing unit (CPU) 808, a memory 810, a mass storage device 812, a video adapter 814, an I/O interface 816 connected to a bus 818. The bus 818 may be one or more of any type of several bus architectures, including a memory bus or memory controller, a peripheral bus, or video bus. The CPU 808 may include any type of electronic data processor, and the memory 810 may include any type of system memory, such as static random access memory (SRAM), dynamic random access memory (DRAM), or read-only memory (ROM). The mass storage device 812 may include any type of storage device configured to store data, programs, and other information and to make the data, programs, and other information accessible via the bus 818. The mass storage device 812 may include, for example, one or more of a hard disk drive, a magnetic disk drive, or an optical disk drive. The video adapter 814 and the I/O interface 816 provide interfaces to couple external devices to the processing unit 802. Examples of external devices include the display 804 coupled to the video adapter 814 and the I/O device 806, such as a mouse, keyboard, printer, and the like, coupled to the I/O interface 816. Other devices may be coupled to the processing unit 802, and additional or fewer interface cards may be utilized. For example, a serial interface card (not shown) may be used to provide a serial interface for a printer. The processing unit 802 also may include a network interface 820 that may be a wired link to a local area network (LAN) or a wide area network (WAN) 822 and/or a wireless link.

It should be noted that the processor based system may include other components. For example, the processor based system may include power supplies, cables, a motherboard, removable storage media, cases, and the like. These other components, although not shown, are considered part of the processor based system. Further, it should be noted that methods described herein may be implemented on the processor based system, such as by program code executed by the CPU 808.

Even more, it should be noted that the tools in FIG. 1 may be implemented on one or more processor based systems according to FIG. 8. Communication between the different tools may vary depending upon how the tools are implemented. If the tools are implemented on one processor based system, data may be saved in the memory 810 or the mass storage device 812 between the execution of program code for different processes by the CPU 808. The data may then be provided by the CPU 808 accessing the memory 810 or the mass storage device 812 via the bus 818 during the execution of a respective process. If tools are implemented on different processor based systems or if data is to be provided from another storage system, such as a separate database, data may be provided between the systems through the I/O interface 816 or the network interface 820. Similarly, data may be input into one or more processor based systems by the I/O interface 816 or the network interface 820.

Thus, as can be appreciated from above, the present disclosure provides a method for analyzing interconnect process variation. First descriptions of parasitic RC elements in an interconnect structure of an IC are generated by at least one processor. The first descriptions describe the parasitic RC elements respectively at a typical process corner and a peripheral process corner. Sensitivity values are generated by the at least one processor at the peripheral process corner from the first descriptions. The sensitivity values respectively quantify how sensitive the parasitic RC elements are to process variation. The sensitivity values are combined by the at least one processor into a second description of the RC elements that describes the RC elements as a function of a process variation parameter. Simulation is performed by the at least one processor on the second description by repeatedly simulating the second description with different values for the process variation parameter.

In other embodiments, the present disclosure provides a system for analyzing interconnect process variation. A RC extraction tool is configured to generate first descriptions of parasitic RC elements in an interconnect structure of an IC. The first descriptions describe the RC elements respectively at a typical process corner and a peripheral process corner.

A sensitivity extraction tool is configured to generate sensitivity values at the peripheral process corner from the first descriptions and to combine the sensitivity values into a second description of the interconnect structure. The second description describes the RC elements as a function of a process variation parameter and the sensitivity values. A simulation tool is configured to performing simulation on the second description by repeatedly simulating the second description with different values for a process variation parameter.

In yet other embodiments, the present disclosure provides a method for analyzing interconnect process variation. First descriptions of parasitic RC elements in an interconnect structure of an IC are generated. The first descriptions describe the parasitic RC elements respectively at a typical process corner and a plurality of peripheral process corners. Sensitivity values are generated at the peripheral process corners from the first descriptions. The sensitivity values respectively quantify how sensitive the RC elements are to process variation at the peripheral process corners. The sensitivity values are combined into a second description of the RC elements that describes the RC elements as a function of a process variation parameter and a process corner parameter. Simulation is performed on the second description by repeatedly simulating the second description with different combinations of values for the process variation parameter and the process corner parameter. The first descriptions and the sensitivity values are generated by at least one processor, the sensitivity values are combined into the second description by the at least one processor, and the simulation is performed by the at least one processor The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for analyzing interconnect process variation, the method comprising:
   generating, by at least one processor, first descriptions of parasitic resistance-capacitance (RC) elements in an interconnect structure of an integrated circuit (IC), the first descriptions describing the parasitic RC elements respectively at a typical process corner and a peripheral process corner;
   generating, by the at least one processor, sensitivity values at the peripheral process corner from the first descriptions, wherein the sensitivity values respectively quantify how sensitive the parasitic RC elements are to process variation;
   combining, by the at least one processor, the sensitivity values into a second description of the parasitic RC elements that describes the parasitic RC elements as a function of a process variation parameter;
   pseudo randomly generating, by the at least one processor, values of the process variation parameter; and
   repeatedly simulating, by the at least one processor, the second description with the pseudo randomly generated values for the process variation parameter.

2. The method according to claim 1, wherein generating the first descriptions comprises performing RC extraction on a layout of the IC using RC technology files at the typical and peripheral process corners.

3. The method according to claim 2, wherein generating the first descriptions comprises:
matching geometric patterns of the interconnect structure to corresponding geometric patterns in the RC technology files; and
extracting descriptions of parasitic RC elements associated with matching geometric patterns from the RC technology files.

4. The method according to claim 1, wherein generating the sensitivity values comprises:
normalizing values of the parasitic RC elements that are at the peripheral process corner by subtracting corresponding values of the parasitic RC elements that are at the typical process corner.

5. The method according to claim 4, wherein generating the sensitivity values comprises:
performing principal component analysis (PCA) or singular value decomposition (SVD) on the normalized values of the parasitic RC elements.

6. The method according to claim 1, wherein generating the sensitivity values comprises:
individually analyzing conductive features in the interconnect structure to determine resistance sensitivity values for parasitic resistance elements in the interconnect structure, wherein the sensitivity values comprise the resistance sensitivity values.

7. The method according to claim 1, wherein generating the sensitivity values comprises:
individually analyzing pairs of capacitively-coupled segments in the interconnect structure to determine capacitance sensitivity values for parasitic capacitive elements in the interconnect structure, wherein the sensitivity values comprise the capacitance sensitivity values.

8. The method according to claim 7, wherein the individually analyzing pairs of capacitively-coupled segments in the interconnect structure comprises:
decoupling parasitic capacitance values of a pair of capacitively-coupled segments by apportioning the parasitic capacitance values by width values of the capacitively-coupled segments of the pair.

9. The method according to claim 1, further comprising:
grouping conductive layers of the interconnect structure; and
for each group of conductive layers, individually generating sensitivity values at the peripheral process corner from the first descriptions.

10. The method according to claim 9, further comprising:
combining the sensitivity values into the second description such that the second description describes the parasitic RC elements as a function of a plurality of process variation parameters, wherein the plurality of process variation parameters comprises a parameter for each of the groups.

11. The method according to claim 9, further comprising:
combining the sensitivity values into the second description such that the second description describes the parasitic RC elements as a function of resistance variation parameters and capacitance variation parameters individual to the groups.

12. A system for analyzing interconnect process variation, the system comprising:

a resistance-capacitance (RC) extraction tool configured to generate first descriptions of parasitic RC elements in an interconnect structure of an integrated circuit (IC), wherein the first descriptions describe the parasitic RC elements respectively at a typical process corner and a peripheral process corner;
a sensitivity extraction tool configured to generate sensitivity values at the peripheral process corner from the first descriptions and to combine the sensitivity values into a second description of the interconnect structure, wherein the second description describes the parasitic RC elements as a function of a process variation parameter and the sensitivity values; and
a simulation tool configured to pseudo randomly generate values of the process variation parameter, and to repeatedly simulate the second description with the pseudo randomly generated values, wherein each simulation simulates the second description with the process variation parameter set to a different one of the pseudo randomly generated values.

13. The system according to claim 12, wherein the sensitivity extraction tool is further configured to perform principal component analysis (PCA) or singular value decomposition (SVD) on values of the parasitic RC elements to generate the sensitivity values.

14. The system according to claim 12, wherein the sensitivity extraction tool is further configured to:
individually analyze pairs of capacitively-coupled segments in the interconnect structure; and
decouple parasitic capacitance values of a pair of capacitively-coupled segments by apportioning the capacitance values by width values for the capacitively-coupled segments of the pair.

15. The system according to claim 12, wherein the sensitivity extraction tool is further configured to:
group conductive layers of the interconnect structure; and
individually generate sensitivity values for each group of conductive layers.

16. The system according to claim 15, wherein the sensitivity extraction tool is further configured to:
combine the sensitivity values into the second description such that the second description describes the parasitic RC elements as a function of a plurality of process variation parameters, wherein the plurality of process variation parameters comprises a parameter for each group of conductive layers.

17. A method for analyzing interconnect process variation, the method comprising:
generating, by at least one processor, first descriptions of parasitic resistance-capacitance (RC) elements in an interconnect structure of an integrated circuit (IC), the first descriptions describing the parasitic RC elements respectively at a typical process corner and a plurality of peripheral process corners;
generating, by the at least one processor, sensitivity values at the peripheral process corners from the first descriptions, wherein the sensitivity values respectively quantify how sensitive the parasitic RC elements are to process variation at the peripheral process corners;
combining, by the at least one processor, the sensitivity values into a second description of the parasitic RC elements that describes the parasitic RC elements as a function of a process variation parameter and a process corner parameter;
pseudo randomly generating, by the at least one processor, simulation vectors, wherein each of the simulation vectors comprises a variation value of the process variation parameter and a corner value of the process corner parameter; and performing, by the at least one processor, a simulation on the second description by repeatedly simulating the second description with the pseudo randomly generated simulation vectors, wherein each simulation simulates the second description with the process variation parameter and the process corner parameter respectively set to the variation value and the corner value in a different one of the pseudo randomly generated simulation vectors.

18. The method according to claim 17, further comprising generating the first descriptions at:
a process corner of minimum net capacitance and maximum net resistance in the interconnect structure;
a process corner of maximum net capacitance and minimum net resistance in the interconnect structure;
a process corner of minimum net resistance and maximum net capacitance in the interconnect structure; and
a process corner of maximum net resistance and minimum net capacitance in the interconnect structure.

19. The method according to claim 17, wherein generating the sensitivity values comprises:
individually analyzing pairs of capacitively-coupled segments in the interconnect structure to determine the sensitivity values; and
decoupling parasitic capacitance values of a pair of capacitively-coupled segments by apportioning the capacitance values by width values for the capacitively-coupled segments of the pair.

20. The method according to claim 17, further comprising:
grouping conductive layers of the interconnect structure; and
combining the sensitivity values into the second description such that the second description describes the parasitic RC elements as a function of a plurality of process variation parameters and a plurality of process corner parameters, wherein the plurality of process variation parameters and the plurality of process corner parameters are individual to groups of conductive layers in the interconnect structure.

* * * * *